US006454987B1

(12) United States Patent
Katoh et al.

(10) Patent No.: US 6,454,987 B1
(45) Date of Patent: *Sep. 24, 2002

(54) MICRO STRUCTURE AND ITS MANUFACTURE METHOD

(75) Inventors: Takanori Katoh, Kusatsu (JP); Yanping Zhang, Kusatsu (JP)

(73) Assignee: Sumitomo Heavy Industries, Inc., Tokyo (JP)

( * ) Notice: Subject to any disclaimer, the term of this patent is extended or adjusted under 35 U.S.C. 154(b) by 117 days.

This patent is subject to a terminal disclaimer.

(21) Appl. No.: 09/602,273

(22) Filed: Jun. 23, 2000

Related U.S. Application Data

(62) Division of application No. 09/098,289, filed on Jun. 16, 1998, now Pat. No. 6,159,413.

(30) Foreign Application Priority Data

Jun. 19, 1997 (JP) .............................................. 9-163148

(51) Int. Cl.[7] .............................................. B29C 59/16
(52) U.S. Cl. ..................... 264/447; 264/473; 264/482; 264/488; 425/174.4; 425/174.14; 378/68; 378/69; 378/64; 219/121.6; 219/121.65; 219/121.66; 219/121.67; 219/121.68; 219/121.69; 219/121.82
(58) Field of Search ................................ 264/488, 400, 264/482, 473, 447; 425/174.4, 174.14; 378/68, 69, 64; 219/121.6, 121.65, 121.66, 121.67, 121.68, 121.69, 121.82

(56) References Cited

U.S. PATENT DOCUMENTS

| 4,493,753 A | | 1/1985 | Becker et al. | |
|---|---|---|---|---|
| 5,260,175 A | * | 11/1993 | Kowanz et al. | ............. 430/326 |
| 5,307,561 A | | 5/1994 | Feigenbaum et al. | |
| 5,512,161 A | * | 4/1996 | Dinglreiter et al. | ............ 205/67 |
| 5,730,924 A | | 3/1998 | Katoh et al. | ................. 264/488 |
| 5,756,254 A | * | 5/1998 | Kihara et al. | ............. 430/270.1 |

FOREIGN PATENT DOCUMENTS

| EP | 0 607 680 A2 | 7/1994 |
|---|---|---|
| JP | 1-217921 | 8/1989 |
| JP | 05-279873 | 10/1993 |
| JP | 08-083756 | 3/1996 |

OTHER PUBLICATIONS

Copy of Office Action and English translation dated Jan. 22, 2002 issued by the Japanese Patent Office in connection with a counterpart Japanese patent application No. 9–163148.

The Transactions of the Institute of Electrical Engineers of Japan, a publication of Electronics, Information and Systems Society, vol. 116, Dec. 1996, pp. 1341–1347 (English translation not available).

Zhang et al, "Synchrotron Radiation Micromachining of Polymers to Produce High–Aspect–Ratio Microparts", Japanese Journal of Applied Physics, JP, Publication Office Japanese Journal of Applied Physics, Tokyo, vol. 35, Part 2, Mo. 2A, pp. L186–L188 XP000730588, ISSN: 0021–4922—entire document.

Zhang et al, "High Aspect Ratio Micromachining Teflon by Direct Exposure to Synchrotron Radiation", Applied Physics Letters, U.S., American Institute of Physics, New York, vol. 67, No. 6, pp. 872–874, XP000674181, ISSN: 0003–6951—entire document.

* cited by examiner

*Primary Examiner*—Suzanne E. McDowell
(74) *Attorney, Agent, or Firm*—Frishauf, Holtz, Goodman & Chick, P.C.

(57) ABSTRACT

A laminated substrate is prepared, the laminated substrate having two layers including a first film and a second film in tight contact with the first film, the second film being made of a material capable of being etched with synchrotron radiation light. A mask member with a pattern is disposed in tight contact with the surface of the second film of the laminated structure or at a distance from the surface of the second film, the pattern of the mask member being made of a material not transmitting the synchrotron radiation light. The synchrotron radiation light is applied on a partial surface area of the second film via the mask member to etch the second film where the synchrotron radiation light is applied and to expose a partial surface area of the first film on the bottom of an etched area.

6 Claims, 7 Drawing Sheets

MICRO STRUCTURE AND ITS MANUFACTURE METHOD

This is division of application Ser. No. 09/098,289 filed Jun. 16, 1998 now U.S. Pat. No. 6,159,403.

This application is based on Japanese Patent Application No. HEI-9-163148 filed on Jun. 19, 1997, the entire contents of which are incorporated herein by reference.

BACKGROUND OF THE INVENTION a) Field of the Invention

The present invention relates to a micro structure and its manufacturing method, and more particularly to micro machines and a manufacturing method suitable for fabrication of micro machines.

b) Description of the Related Art

As a manufacturing method for micro structures, techniques of Lithographie Galvanoformung Abformung (LIGA) are known. Conventional LIGA techniques will be briefly described.

A photoresist film is formed on a conductive support substrate. This photoresist film is locally exposed with X-rays by using a LIGA mask having a high contrast, and thereafter developed and patterned. Regions where the photoresist film is removed are filled with metal by galvanizing. As the photoresist film is removed, a micro structure made of metal can be formed.

With LIGA techniques, it takes generally several hours to expose and develop a photoresist film. A photoresist mask having a high contrast is also required.

SUMMARY OF THE INVENTION

It is an object of the present invention to provide a method of manufacturing a micro structure having a shortened process time.

It is another object of the present invention to provide a composite micro structure made of a combination of different materials.

According to one aspect of the present invention, there is provided a method of manufacturing a micro structure comprising the steps of: preparing a laminated substrate of two layers including a first film and a second film in tight contact with the first film, the second film being made of a material capable of being etched with synchrotron radiation light; disposing a mask member with a pattern in tight contact with a surface of the second film of the laminated structure or at a distance from the surface of the second film, the pattern of the mask member being made of a material not substantially transmitting the synchrotron radiation light; and applying the synchrotron radiation light on a partial surface area of the second film via the mask member to etch the second film where the synchrotron radiation light is applied and to expose a partial surface area of the first film on a bottom of an etched area.

Since the second film is etched by applying radiation light, a process time can be shortened as compared to LIGA techniques which utilizes exposure and development processes.

According to another aspect of the present invention, there is provided a micro structure comprising: a first film made of a material having an etching resistance to radiation light different from an etching resistance of polytetrafluoroethylene; and a second film in tight contact with the first film and made of polytetrafluoroethylene, the second film being patterned, and a surface of the first film being exposed in an area where a pattern of the second film is not formed.

By using this micro structure, a micro machine made of plastics can be formed.

According to another aspect of the present invention, there is provided a micro structure comprising: a polytetrafluoroethylene film having a through hole; and a metal member filling the through hole.

A micro structure can be formed by selecting each material of each region of the structure so as to satisfy the mechanical and electrical characteristics required for the region.

As described above, it is possible to perform micro processing by using radiation light. A micro composite material can be formed by filing a micro space in a micro structure with another material.

DETAILED DESCRIPTION OF THE PREFERRED EMBODIMENTS

Figure 1A:
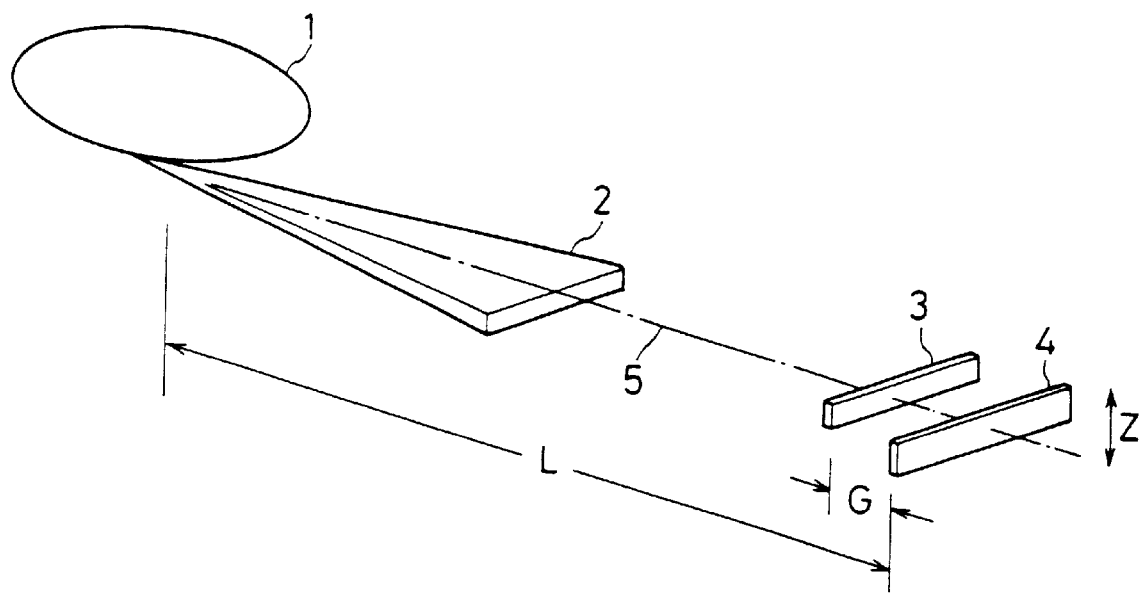
FIG. 1A is a schematic diagram showing a working system used by the embodiments of the invention.

FIG. 1A is a schematic diagram showing a working system used by a method of manufacturing a micro structure according to the embodiments. A synchrotron radiation light (SR light) is emitted along an optical axis of an orbit of electrons accumulated in a synchrotron. A workpiece 4 is placed at a distance L from the radiation light source on the optical axis 5. In front of the workpiece 4, a mask 3 is disposed at a distance G. The electron orbit 1, workpiece 4 and mask 3 are housed in the same vacuum chamber.

The mask 3 has regions substantially not transmitting SR light and regions substantially transmitting the SR light. A region substantially transmitting SR light is a region through which SR light having an intensity strong enough to process the workpiece passes, and a region substantially not transmitting SR light is a region through which SR light cannot pass or even if it passes, the SR light is attenuated to an intensity not enough to process the workpiece.

The mask used in the embodiments is made of a copper plate of 10 to 100 $\mu$m in thickness, and has a pattern of a desired micro component. The mask may be made of other metal instead of copper. The thickness of the mask may be about 2 to 10 $\mu$m.

The SR light 2 is applied to the surface of the workpiece 4. A surface region of the workpiece 4 where the SR light is applied is removed through etching. By forming a micro pattern on the surface of the mask 3, the surface of the workpiece 4 can be processed to have a micro pattern.

Figure 1B:
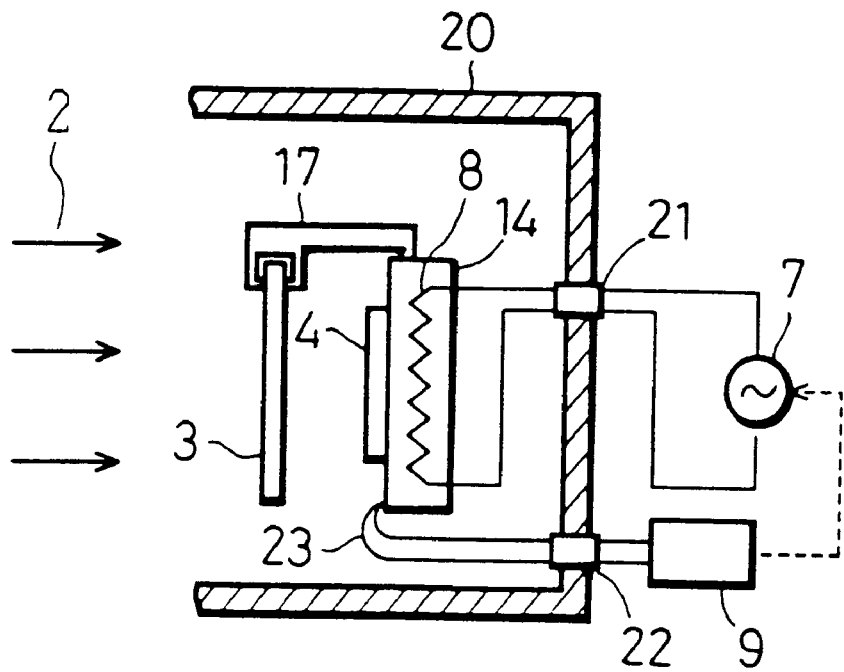
FIGS. 1B and 1C are schematic cross sectional views of the working system.

FIG. 1B is a cross sectional view of a working unit. In a vacuum chamber 20, a sample holding stage 14 is mounted. A workpiece 4 is placed on the sample holding surface of the sample holding stage 14. A mask 3 is disposed in front of the workpiece 4 by a mask holder 17. The mask 3 may be set in contact with the surface of the workpiece 4, or spaced apart therefrom by some distance. In processing the workpiece 4, SR light 2 is applied from the left side in FIG. 1B to the surface of the workpiece 4 through the mask 3.

The sample holding stage 14 is made of, for example, ceramics and has a heater 8 embedded therein. Lead wires of the heater 8 are connected to one ends of terminal 21 which pass through the wall of the vacuum chamber 20, and the other ends of the terminal 21 are connected via cables to a power source 7 which supplies current to the heater 8. As current flows through the heater 8, the workpiece 4 is heated.

A thermocouple 23 is mounted on the sample holding surface of the sample holding stage 14. Lead wires of the thermocouple 23 extend via a lead wire output port 22 to the outside of the vacuum chamber 20, and are connected to a temperature controller 9. The lead wire output port 22 is sealed, for example, by solder. This temperature controller 9 controls the power source 7 to regulate the amount of current flowing through the heater 8 and set the temperature of the sample holding surface to a desired temperature.

Figure 1C:
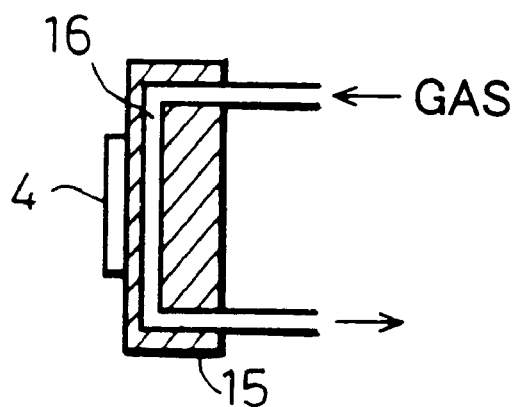

FIG. 1C shows another example of the structure of the sample holding stage. A gas flow path 16 is formed inside of a sample holding stage 15. Gas at a desired temperature is flowed through the gas flow path 16 to exchange heat with a workpiece 4, to thereby maintain the workpiece at a desired temperature.

Figure 2:
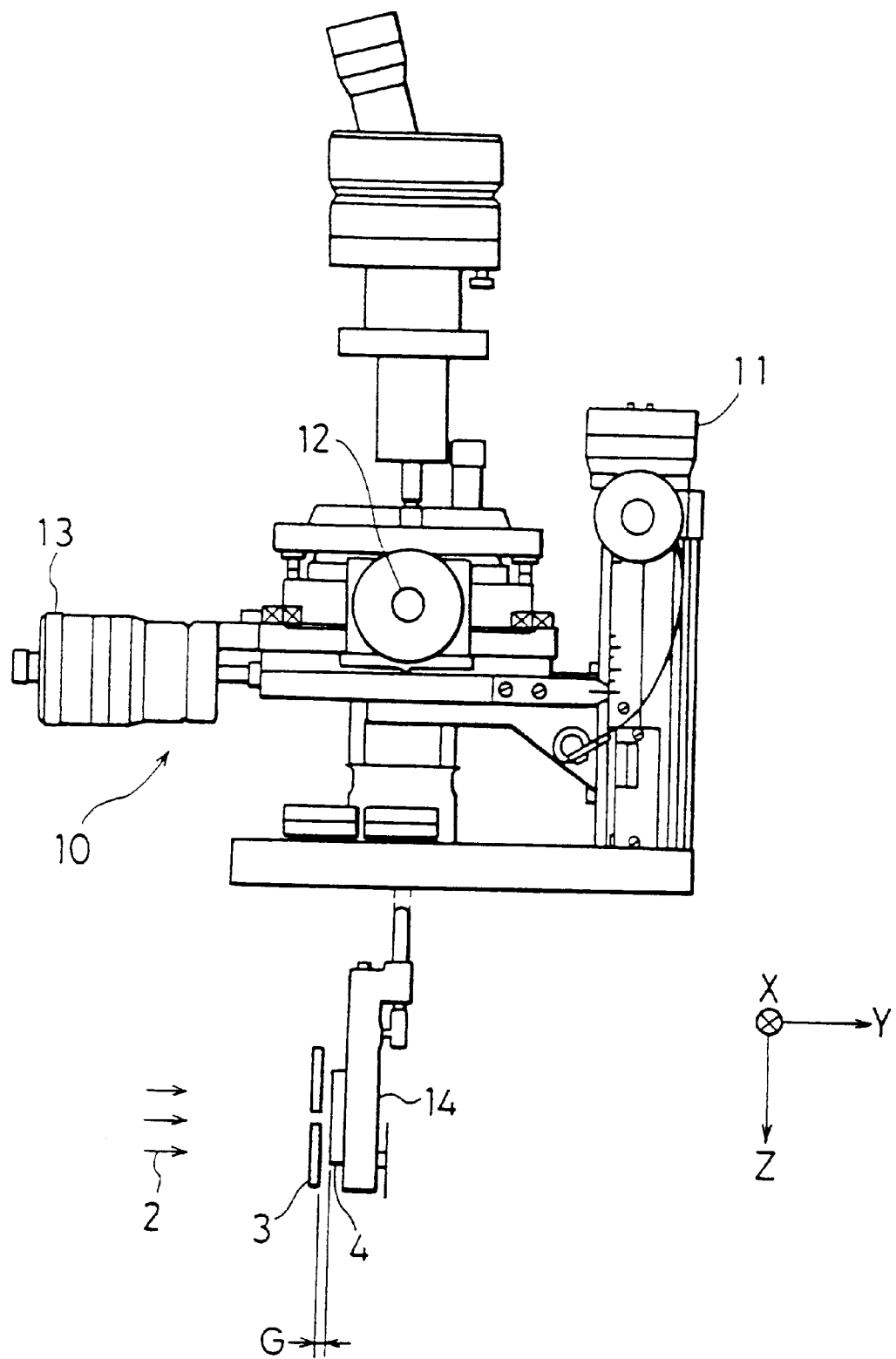
FIG. 2 is a front view of a drive mechanism used by the working system shown in FIGS. 1A to 1C.

FIG. 2 shows a Z-axis direction drive mechanism for a workpiece 4 and a mask 3. A sample holding stage 14 is mounted on the drive mechanism 10, with its sample holding surface being set generally perpendicular to an optical axis direction (Y-axis direction) of SR light 2. The workpiece 4 is mounted on the sample holding surface of the sample holding stage 14, and the mask 3 is disposed at a distance G from the surface of the workpiece 4.

The drive mechanism 10 has handles 11, 12 and 13. As the handle 11 is rotated, the sample holding stage 14 moves in the up/down direction as in FIG. 2 (Z-axis direction). The handle 11 is rotated by using stepping motor to move the stage at a desired constant speed.

As the handles 12 and 13 are rotated, the sample holding stage 14 moves in a direction vertical to the drawing sheet (X-axis direction) and in the Y-axis direction. With these handles 12 and 13, the position of the sample holding stage 14 can be minutely adjusted both in the X- and Y-axis directions.

As the handle 11 is rotated by using the stepping motor while SR light 2 is applied to the surface of the workpiece 4, the workpiece 4 moves along the Z-axis direction so that a relatively large area can be processed with ease.

Next, a method of manufacturing a micro structure according to the first embodiment of the invention will be described with reference to FIGS. 3A to 3F.

Figure 3A:
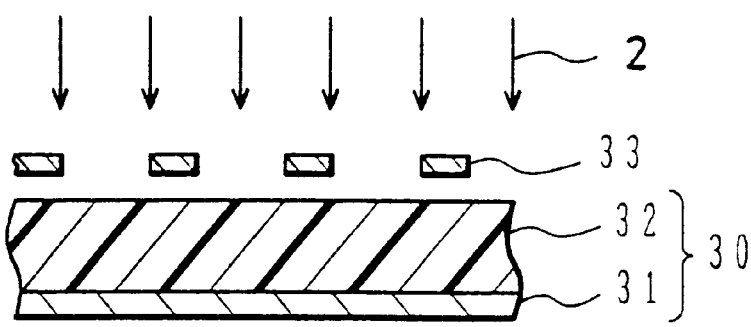
FIGS. 3A to 3F are cross sectional views illustrating processes of a method of manufacturing a micro structure according to a first embodiment of the invention.

As shown in FIG. 3A, a substrate 30 is prepared which is a lamination of a metal film 31 and a polytetrafluoroethylene film 32 tightly coupled to the metal film 31. For example, the substrate 30 may be formed by depositing an Ni film and a Cu film through galvanizing on a polytetrafluoroethylene film, or by placing a polytetrafluoroethylene film on a Cu plate and heating and pressing to adhere them through melting. In this embodiment, the thickness of the metal film 31 is 20 $\mu$m and the thickness of the polytetrafluoroethylene film 32 is 300 $\mu$m.

A mask member 33 is disposed at a predetermined distance from the surface of the polytetrafluoroethylene film 32. The mask member 33 is a stainless sheet having a plurality of slits of 100 $\mu$m in width disposed at an interval of 200 $\mu$m.

SR light 2 is applied via the mask member 33 to the polytetrafluoroethylene film 32. Regions of the polytetrafluoroethylene film 32 where the SR light 2 is applied are etched and removed. Since the metal film 31 is not etched, the etching stops when the surface of the metal film 31 is exposed.

The whole thickness of the polytetrafluoroethylene film 32 of 300 $\mu$m in thickness could be etched in about 10 minutes at the substrate temperature of 200° C. through exposure of SR light having a photon density of about $6\times10^{15}$ photons/s·mm². With conventional LIGA techniques, exposure of about 2 to 3 hours and development of about 2 to 3 hours become necessary for a photoresist film having a thickness of about 300 $\mu$m. In this embodiment, it is possible to process a polytetrafluoroethylene film in a short time.

Figure 3B:
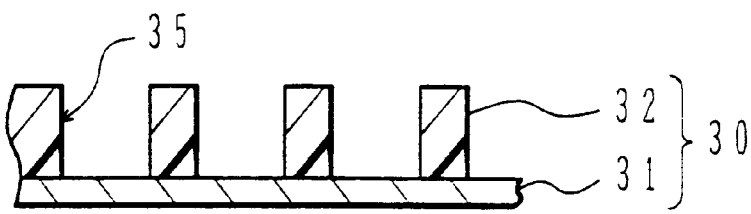

FIG. 3B shows the surface of the metal film 31 partially exposed. The polytetrafluoroethylene film 32 is formed with grooves 35 corresponding to the slits of the mask member 33.

Figure 3C:
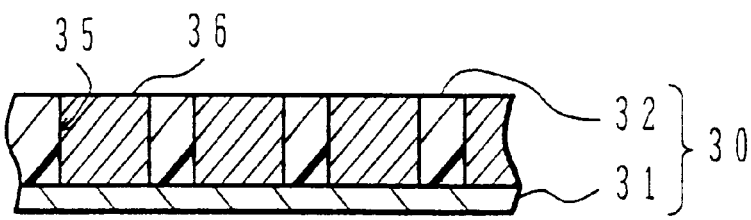

As shown in FIG. 3C, metal such as Cu, Ni and Pt is deposited through galvanizing on the surface of the metal film 31 exposed on the bottom of the groove 35. The groove 35 is therefore filled with a metal material 36 such as Cu, Ni and Pt.

SR light or electron beams are applied to the left polytetrafluoroethylene film 32. If SR light is applied, the polytetrafluoroethylene film 32 is etched, whereas if electron beams are applied, the polytetrafluoroethylene film 32 deteriorates its quality and changes to powder-like substances so that the polytetrafluoroethylene film 32 can be easily removed.

Figure 3D:
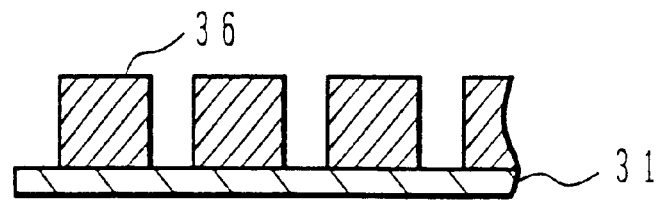

FIG. 3D is a cross sectional view showing the substrate after the polytetrafluoroethylene film 32 is removed. The metal member 36 is left on the metal film 31. The metal members 36 are disposed at a pitch of 100 $\mu$m, each having a width of about 200 $\mu$m. A micro structure made of a metal is therefore formed.

Figure 3E:
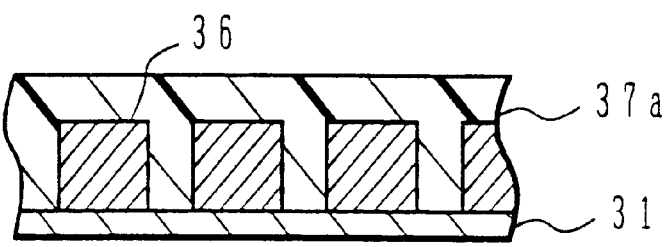
Figure 3F:
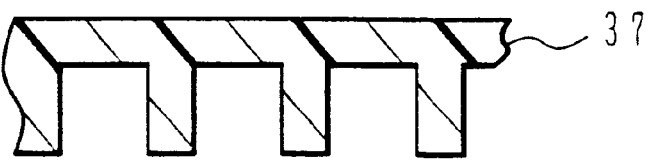

As shown in FIG. 3E, a plastics material 37a is flowed onto the surface of the metal film 31 for molding the plastics material 37a. As the plastics material 37a is peeled off from the metal film 31, a micro structure 37 made of plastics is formed.

Next, a method of manufacturing a micro structure according to a modification of the first embodiment will be described with reference to FIGS. 4A to 4C.

Figure 4A:
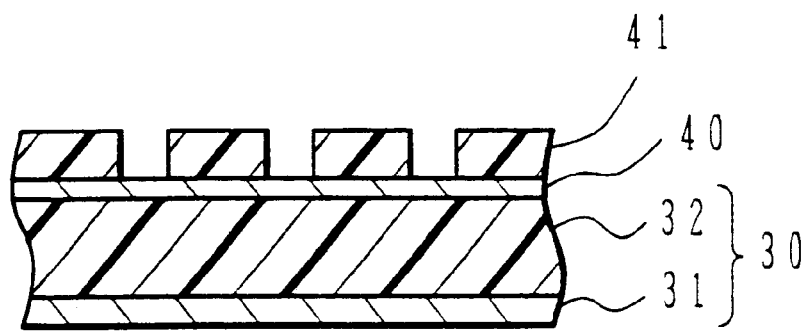
FIGS. 4A to 4C are cross sectional views illustrating processes of a method of manufacturing a micro structure according to a modification of the first embodiment.

As shown in FIG. 4A, a metal film 40 made of Cu or the like is deposited to a thickness of 2 to 20 $\mu$m on the surface of a polytetrafluoroethylene film 32 of a laminated substrate 30 same as that shown in FIG. 3A. A resist pattern 41 is formed on the metal film 40. The resist pattern 41 is formed by coating a resist film and exposing and developing it via a photo mask. This exposure is performed using visual light or ultraviolet light. The photo mask may be a mask commonly used in this field, such as a glass substrate formed with a Cr pattern.

By using the resist pattern 41 as a mask, the metal film 40 is etched to form openings. After the openings are formed, the resist pattern 41 is removed.

Figure 4B:
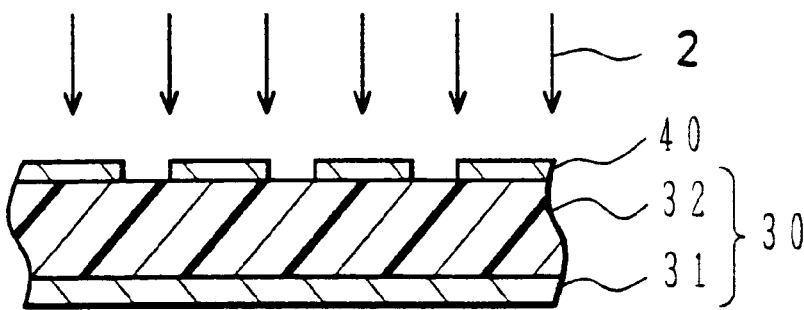

FIG. 4B is a cross sectional view of the substrate 30 and metal film 40 after the resist pattern 41 is removed. Next, SR light 2 is applied to the surface of the laminated substrate 30. The polytetrafluoroethylene film 32 exposed in the openings of the metal film 40 is etched.

Figure 4C:
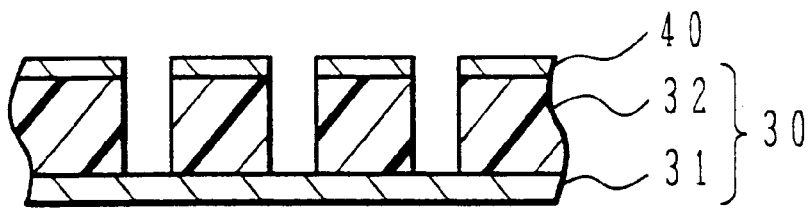

FIG. 4C is a cross sectional view of the substrate 30 and metal film 40 after the polytetrafluoroethylene film 32 is etched. As the metal film 40 is removed, a micro structure similar to that shown in FIG. 3B is formed.

With the method described with FIG. 3A, the mask member 33 is a metal sheet having slits. If it is necessary to make an isolated light shielded area, the mask member 33 shown in FIG. 3A cannot be used. In such a case, another mask member is used which has a membrane made of material transmitting SR light such as SiC and a pattern made of material shielding SR light such as Ti formed on the membrane. However, these mask materials are expensive and moreover have a weak mechanical strength and are not easy to handle.

With the method shown in FIGS. 4A to 4C, a pattern is transferred to the metal film 40 by using a usual mask for visual light or ultraviolet light. Therefore, this method has advantages of low cost and easy-to-handle. Furthermore, since the metal film 40 is in tight contact with the polytetrafluoroethylene film 32, it is easy to form an isolated light shielding area.

Next, a method of manufacturing a micro structure according to a second embodiment of the invention will be described with reference to FIGS. 5A to 5C.

Figure 5A:
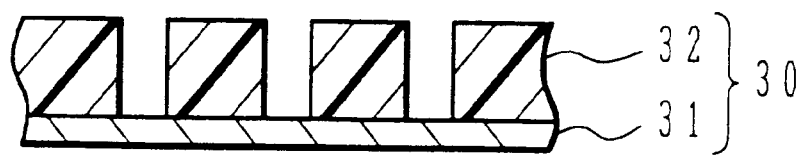
FIGS. 5A to 5C are cross sectional views illustrating processes of a method of manufacturing a micro structure according to a second embodiment of the invention.

A laminated substrate 30 shown in FIG. 5A has the same structure as that of the first embodiment shown in FIG. 3B.

Figure 5B:
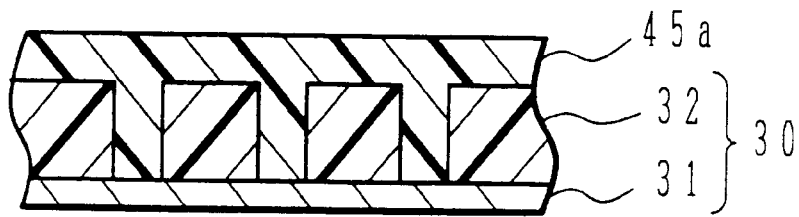
Figure 5C:
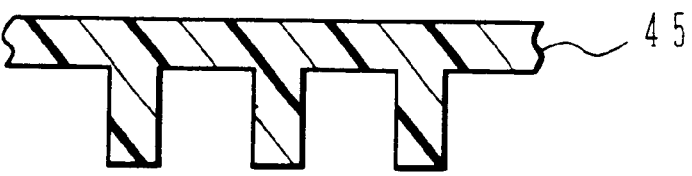

As shown in FIG. 5B, a plastics material 45a is flowed onto the surface of the substrate 30 to mold the plastics material 45a. As the plastics material 45a is peeled off from the substrate 30, a micro structure 45 made of plastics is formed as shown in FIG. 5C.

In the first embodiment, the metal film 31 and the micro metal member 36 formed on the surface of the metal film 31 by galvanizing are used as a mold. Instead, as in the second embodiment, the processed polytetrafluoroethylene film 32 formed on the surface of the metal film 31 may be used as a mold.

In the first and second embodiments, a polytetrafluoroethylene film is used as a material to be processed in a micro shape. Other materials capable of being etched with SR light may also be used, such as crystalline materials of NaCl, LiF and the like.

Next, a method of manufacturing a micro structure according to a third embodiment of the invention will be described with reference to FIGS. 6A to 6C.

Figure 6A:
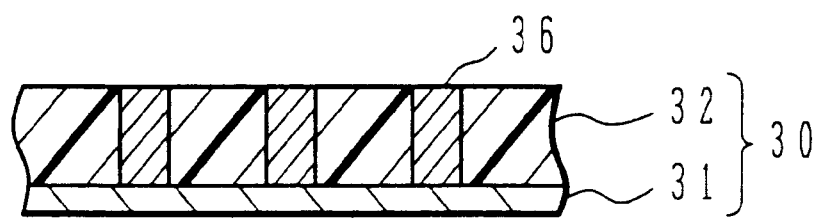
FIGS. 6A to 6C are cross sectional views illustrating processes of a method of manufacturing a micro structure according to a third embodiment of the invention.

A laminated substrate 30 shown in FIG. 6A has the same structure as that of the first embodiment shown in FIG. 3C. The metal film 31 on the bottom of the substrate 30 is removed. If the metal film 31 is made of Cu, it can be removed through etching using, for example, sulfuric acid. While the metal film 31 is etched, the opposite surface of the polytetrafluoroethylene film 32 is covered with a resist film or the like.

If an etching selection ratio of the metal film 31 to the metal member 36 is small, etching is performed under the control of etching time and stopped when the whole thickness of the metal film 31 is removed. If the etching selection ratio of the metal film 31 to the metal member 36 can be made large, only the metal film 31 can be easily etched and removed without strict time control.

Figure 6B:
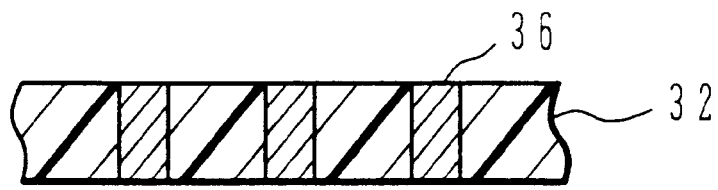

FIG. 6B is a cross sectional view showing the structure of FIG. 6A after the metal film 31 is removed. A fine composite material can be formed, with the metal member 36 being filled in the space of the polytetrafluoroethylene film 32. For example, a composite material can be formed having a region requiring a resistance to chemicals which is made of polytetrafluoroethylene and a region requiring a mechanical strength or an electrical conductivity which is made of metal.

In the process shown in FIG. 6B, although the metal film 31 is fully removed, it may be locally etched.

Figure 6C:
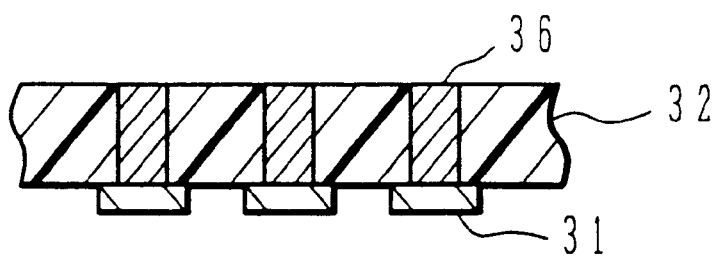

FIG. 6C shows another structure in which the metal film 31 is locally etched to leave it locally in an area corresponding to the metal member 36 and its circumferential area. By locally etching the metal film 31, adhesion between the polytetrafluoroethylene region and the metal region can be enhanced while insulation between respective metal regions is maintained.

If it is not necessary to ensure insulation between respective metal regions, the metal film 31 is not necessarily removed.

In the above embodiments, the polytetrafluoroethylene film having a thickness of about 300 $\mu$m is processed. The thickness is not limited thereto. However, since it takes a long process time if the workpiece becomes thick, a suitable range of the thickness of a workpiece is not thicker than 3000 $\mu$m.

If a micro structure is used as a micro machine, this structure is required to have a mechanical strength more or less. It is therefore preferable to set the thickness of a workpiece to 30 $\mu$m or thicker. However, if the micro structure is not required to have a mechanical strength, the thickness is not limited.

The present invention has been described in connection with the preferred embodiments. The invention is not limited only to the above embodiments. It is apparent that various modifications, improvements, combinations, and the like can be made by those skilled in the art.

What is claimed is:

1. A method of manufacturing a micro structure, comprising:
    preparing a laminated substrate of two layers including a first film and a second film in tight contact with the first film, the second film being made of a material capable of being etched with synchrotron radiation light;
    disposing a mask member with a pattern in tight contact with a surface of the second film or at a distance from the surface of the second film, the pattern of the mask member being made of a material which substantially does not transmit the synchrotron radiation light; and
    applying the synchrotron radiation light on a partial surface area of the second film via the mask member to etch the second film and expose a partial surface area of the first film;
    wherein the first film is made of a conductive material, and the method further comprises:
        after exposing the partial surface area of the first film, depositing a metal member through galvanizing on the exposed partial surface area of the first film to fill, with the metal member, a region where the second film has been etched; and
        applying the synchrotron radiation light or an electron beam to the laminated substrate to remove a remaining portion of the second film.

2. A method according to claim 1, wherein the second film is made of polytetrafluoroethylene.

3. A method of manufacturing a micro structure, comprising:

preparing a laminated substrate of two layers including a first film and a second film in tight contact with the first film, the second film being made of a material capable of being etched with synchrotron radiation light;

disposing a mask member with a pattern in tight contact with a surface of the second film or at a distance from the surface of the second film, the pattern of the mask member being made of a material which substantially does not transmit the synchrotron radiation light;

applying the synchrotron radiation light on a partial surface area of the second film via the mask member to etch the second film and expose a partial surface area of the first film; and molding a plastic material using the first film and portions of the second film left on the partial surface area on the first film, after exposing the partial surface area of the first film.

4. A method according to claim 3, wherein the second film is made of polytetrafluoroethylene.

5. A method of manufacturing a micro structure, comprising:

preparing a laminated substrate of two layers including a first film and a second film in tight contact with the first film, the second film being made of a material capable of being etched with synchrotron radiation light;

disposing a mask member with a pattern in tight contact with a surface of the second film or at a distance from the surface of the second film, the pattern of the mask member being made of a material which substantially does not transmit the synchrotron radiation light;

applying the synchrotron radiation light on a partial surface area of the second film via the mask member to etch the second film and expose a partial surface area of the first film; and after exposing the partial surface area of the first film, depositing a metal member through galvanizing on the exposed partial surface area of the first film to fill, with the metal member, a region where the second film has been etched; and patterning the first film to partially leave the first film at an area corresponding to the metal member and a circumferential area of the metal member.

6. A method according to claim 5, wherein the second film is made of polytetrafluoroethylene.

* * * * *

UNITED STATES PATENT AND TRADEMARK OFFICE
CERTIFICATE OF CORRECTION

| | | |
|---|---|---|
| PATENT NO. | : 6,454,987 B1 | Page 1 of 1 |
| DATED | : September 24, 2002 | |
| INVENTOR(S) | : Takanori Katoh et al. | |

It is certified that error appears in the above-identified patent and that said Letters Patent is hereby corrected as shown below:

<u>Title page,</u>
Item [73], Assignee, change "Inc." to -- Ltd. --;
Item [56], References Cited, OTHER PUBLICATIONS, "Zhang et al." reference, change "Mo. 2A" to -- No. 2A --.

Signed and Sealed this

Seventeenth Day of December, 2002

JAMES E. ROGAN
*Director of the United States Patent and Trademark Office*